United States Patent [19]

Dornstetter

[11] Patent Number: 4,754,458
[45] Date of Patent: Jun. 28, 1988

[54] METHOD OF TRANSMISSION, WITH THE POSSIBILITY OF CORRECTING BURSTS OF ERRORS, OF INFORMATION MESSAGES AND ENCODING AND DECODING DEVICES FOR IMPLEMENTING THIS METHOD

[75] Inventor: Jean-Louis Dornstetter, Versailles, France

[73] Assignee: Laboratoire Central de Telecommunications, Velizy Villacoublay, France

[21] Appl. No.: 862,828

[22] Filed: May 13, 1986

[30] Foreign Application Priority Data

May 30, 1985 [FR] France ................... 85 08098

[51] Int. Cl.⁴ ............................................. G06F 11/10
[52] U.S. Cl. ......................................... 371/40; 371/37
[58] Field of Search .................... 371/37, 38, 39, 40, 371/44, 45

[56] References Cited

U.S. PATENT DOCUMENTS

| | | | |
|---|---|---|---|
| 4,498,178 | 2/1985 | Ohashi | 371/38 X |
| 4,665,523 | 5/1987 | Citron | 371/37 |

FOREIGN PATENT DOCUMENTS

| | | |
|---|---|---|
| 0061345 | 3/1982 | European Pat. Off. . |
| WO81/00316 | 7/1979 | PCT Int'l Appl. . |
| WO85/01625 | 9/1984 | PCT Int'l Appl. . |

OTHER PUBLICATIONS

"Bit-Serial Reed-Solomon Encoders" by E. R. Berlekamp, IEEE Transactions on Information Theory, vol. iT-28, No. 6, Nov. 1982, pp. 869-874.
Archiv Für Elektronik und Übertragungstechnik: vol. 38, No. 5, Sep.-Oct. 1984, Würzburg, DE; Article by M. Prögler et al., "Realisierung Algebraischer Fehlerkorrektur mit Standard-Mikrorechnern" pp. 281 to 289.
IEEE Transactions on Information Theory: vol. IT-19, No. 5, Sep. 1973; Article by E. R. Berlekamp "Goppa Codes" pp. 590 to 592.
IEEE Transactions on Computers: vol. C-33, No. 2, Feb. 1984, New York; Article by Kuang Yung Liu "Architecture for VLSI Design of Reed-Solomon Decoders" pp. 178 to 189.
The Transactions of the IECE of Japan: vol. E 64, No. 10, Oct. 1981, Tokyo; Article by E. Fujiwara et al., "Fault-Tolerant Arithmetic Logic Unit Using Parity--Based Codes" pp. 653 to 660.

Primary Examiner—Joseph Ruggiero
Assistant Examiner—Robert W. Beausoliel
Attorney, Agent, or Firm—Cushman, Darby & Cushman

[57] ABSTRACT

A method and apparatus for transmitting information while correcting bursts of errors is described. The technique uses a calculation of coefficients of code words by obtaining polynomials from the factorization over a field of elements. On transmitting, a product of a plurality of polynomials is obtained and this product is divided by another polynomial to obtain coefficients. On reception, a reciprocal of the polynomial is used and coefficients are also calculated. By summing the most significant coefficients of the polynomials, corrected bits of the message are obtained.

17 Claims, 6 Drawing Sheets

METHOD OF TRANSMISSION, WITH THE POSSIBILITY OF CORRECTING BURSTS OF ERRORS, OF INFORMATION MESSAGES AND ENCODING AND DECODING DEVICES FOR IMPLEMENTING THIS METHOD

BACKGROUND OF THE INVENTION

This invention relates to a method of transmission, with the possibility of correcting error bursts, of information messages with k bits by means of code words with n bits forming s blocks of size $d_i$, where i varies from 1 to s, s being the number of polynomials $P_i(X)$ resulting from the factorization of $X^n+1$ over the field GF(2) with two elements and $d_i$ the degree of the polynomial $P_i(X)$.

The invention also relates to an encoding device and a decoding device for applying this method.

In transmission of information or data, there is often an increasing need for processes at least enabling transmission errors to be detected and, in most cases, attempts are made to correct these errors.

As regards the correction of one or several errors in the transmission, there are a great number of correction methods and a description of many types of code is given in the literature. However, attempts are being increasingly made to detect and also to correct bursts of errors, in order to improve the reliability of information transmission systems. Amongst the families of codes enabling satisfactory performances to be obtained, one of the most effective is that of the Bose-Chaudhuri-Hocquenghem (BCH) codes and, in particular, amongst these, the Reed-Solomon codes are amongst the most powerful and much research and application work has been carried out on them. The code words obtained can be considered as combinations of the elements of a Galois field $GF(2^m)$ and in order to process them, it is necessary to use specialized circuits consisting of complex arrangements of logic gates. In general, these circuits have an irregular diagram lay-out and call for a considerable number of special connections. Consequently, they are difficult to build in integrated circuit form. In addition, if it is intended to perform the necessary operations of multiplication of polynomials by means of read-only memories, these operations quickly become highly complicated and impracticable in integrated form as soon as the very lowest orders are exceeded.

Furthermore, correction of bursts of errors, even for BCH codes, requires a fairly considerable number of redundant bits.

SUMMARY OF THE INVENTION

One of the objects of the present invention is hence an improved transmission method correcting these disadvantages, thanks to the definition of a family of special and more efficient codes which is, in particular, no more costly in terms of redundant bits than are the Reed-Solomon codes.

A further object of the invention is a transmission method resulting in encoding and decoding devices with entirely repetitive structures that can hence readily be integrated.

Before giving a more precise definition of the invention, certain conventions of expression to be used in stating the characteristics of the invention and throughout the description which follows will be indicated. We shall write:

$$A(X) \equiv B(X)[C(X)]$$

to express that the polynomials A(X) and B(X) are congruent modulo C(X), namely:

$$A(X) = C(X) + B(X).$$

Likewise, we shall write $\overline{M(X)}$ for the reciprocal polynomial of the polynomial M(X), in other words:

$$\overline{M(X)} = X^{k-1} M(X^{-1})$$

where $k-1$ is the maximum degree of polynomial M(X), i.e. its degree when the most significant coefficient of M(X) is non-nil.

The derivative of the polynomial $$P_i(X) = \sum_{j=0}^{d_i} p^j X^j$$

will be termed the polynomial $$P'_i(X): P'_i(X) = \sum_{\substack{j=1 \\ j \text{ odd}}}^{d_i} p^j X^{j-1}.$$

Lastly, the signs $+$ and $\epsilon$ used relate to the binary addition or modulo 2 addition. In particular, the sign $\oplus$ will be used for this addition when this corresponds to a hardware circuit carrying out this operation and fulfilling the exclusive OR function.

In accordance with one characteristic of the invention, it is provided a method of transmission, with the possibility of correcting bursts of errors, of information messages with k bits by means of code words with n bits forming s blocks of size $d_i$, where i varies from 1 to s, s being the number of polynomials $P_i(X)$ resulting from the factorization of $X^n+1$ over the field GF(2) with two elements and $d_i$ the degree of the polynomial $P_i(X)$, said method being characterized in that, during transmission:

for each block consisting of the coefficients of a polynomial $m_i(X)$, one calculates the product of the polynomial $\overline{M(X)}$, reciprocal of the polynomial M(X) of degree $k-1$ associated to the message to be transmitted, by the polynomial $A_i(X)$, reciprocal of the polynomial $P'_i(X)$ which is the derivative of the polynomial $P_i(X)$;

said product is divided by the polynomial $\overline{P_i(X)}$, taking as coefficients of the polynomial $m_i(X)$ the coefficients of the remainder of this division, in accordance with the relation $m_i(X) \equiv \overline{m(X)} A_i(X)[\overline{P_i(X)}]$, these coefficients forming the bits of the corresponding block transmitted;

and in that, on reception:

for each block received, a polynomial $S_i(X)$ with n coefficients is calculated, which is the product of the polynomial $\overline{m_i'(X)}$, reciprocal of the polynomial $m_i'(X)$ associated to the block received, multiplied by a reconstitution polynomial $$R_i(X) = \frac{X^n + 1}{P_i(X)},$$

the sum of the said polynomials $S_i(x)$ representing the superimposition of the transmitted message M(X) and an error syndrome;

by means of the first n−k coefficients of the sum of the polynomials $S_i(X)$, the coefficients of the polynomial $\sigma(X)$ are determined, the latter polynomial being the product of the polynomials $P_i(X)$ corresponding to the erroneous blocks i;

one calculates the k most significant coefficients of a correction polynomial $$K(X) = \sum_{i=0}^{n-1} k_i X^i$$

such that:

$$K(X) \equiv \sum_{j=1}^{s} S_j(X) \, [x^{n-k}]$$

and $$\sum_{m=0}^{t_x} \sigma_m \cdot k_{p-m} = 0 \text{ for } p \geq n - k$$

$\sigma_m$ representing the coefficients of the polynomial $\sigma(X)$ of maximum degree $t_x$ authorized for a valid correction, and one performs the sum of each of said k most significant coefficients of the polynomial K(X) with the coefficients of the same significance of the sum of the polynomials $S_i(X)$ in order to derive the k corrected bits of the received message.

With such a method and thanks to adequate design characteristics of the encoding and decoding circuits, one can arrive at identical structures for encoding and calculating the polynomials $S_i(X)$, together with a fully repetitive and simple structure for the error detection and correction circuits. This offers the major advantage of considerably facilitating execution in integrated form.

Furthermore, decoding circuits are obtained allowing pipeline operation, hence used in the best possible way.

BRIEF DESCRIPTION OF THE DRAWINGS

The invention will be better understood and other characteristics and advantages will be brought out by means of the following description and appended drawings, in which.

DETAILED DESCRIPTION OF THE PREFERRED EMBODIMENTS

Figure 1:
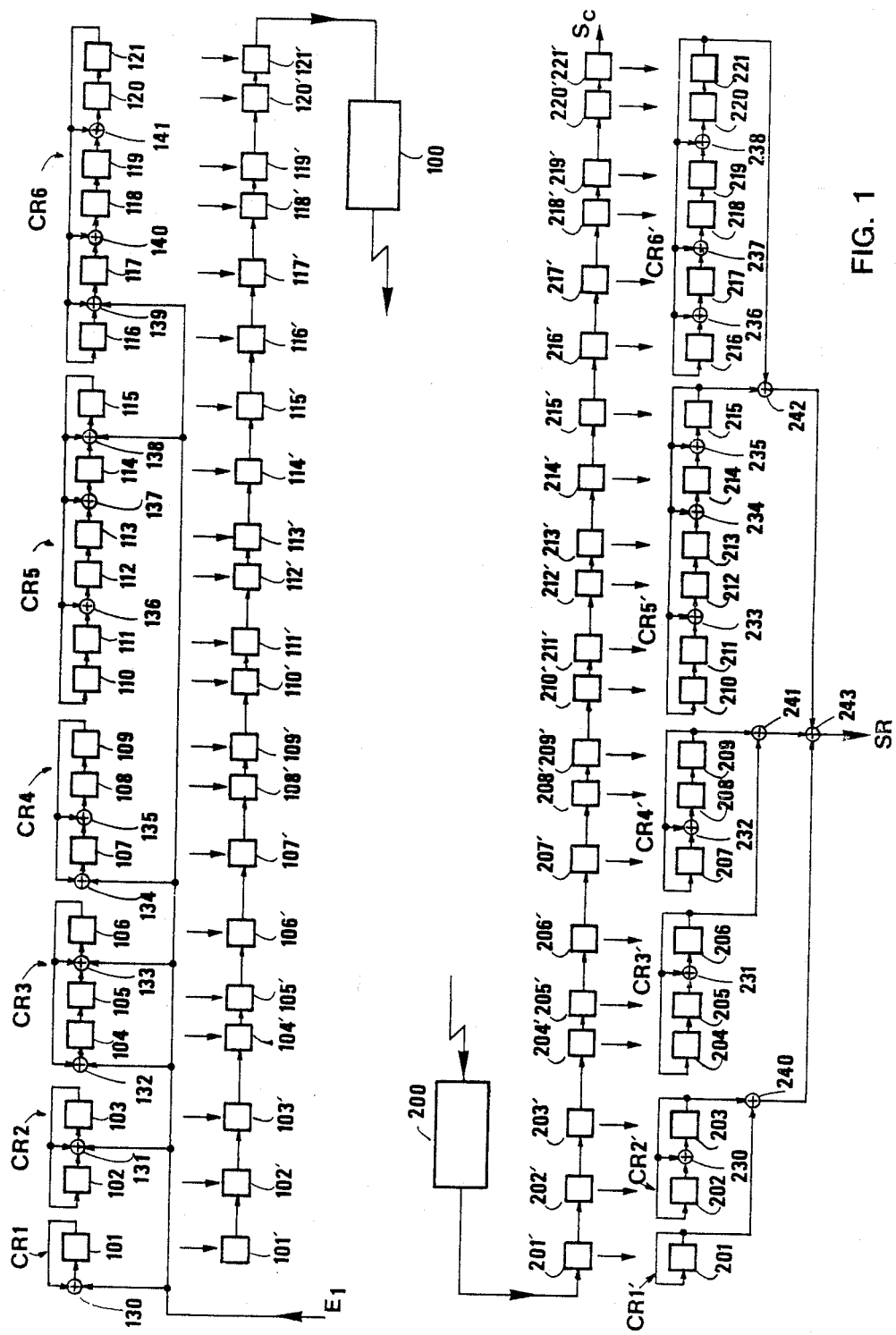
FIG. 1 represents a functional diagram of the encoding circuits and the circuits for calculating the sum of the message and of the syndrome on reception, in an embodiment according to the invention.

The choice of the sub-family of codes made in the transmission method in accordance with the invention is based on the breakdown into s factors $P_i(X)$ of the polynomial $X^n + 1$, where n is odd, in the two-element Galois field GF(2) and also based on the following properties of this breakdown.

If the polynomial, derivative of polynomial $P_i(X)$, is designated by $P_i'(X)$, with i varying from 1 to s, it can be shown that:

$$\sum \frac{XP_i'(X)}{P_i(X)} = \frac{X^n}{X^n + 1}$$

for which the development in series form equals $X^n + X^{2n} + \ldots$.

Accordingly, if we consider a series of s filters of transfer function $$\frac{N_i}{D_i} = \frac{XP_i'(X)}{P_i(X)},$$

to which are applied in succession the coefficients of an information polynomial and if the outputs from these s filters be summed, we normally arrive at the n bits applied to the input with a delay of n clock pulses and a period n.

From these properties, a transmission process has hence been conceived, in which the encoding consists in associating to an information polynomial M(X) the remainders $m_i(X)$ of dividing $XP_i'(X) M(X)$ by $P_i(X)$.

In fact, for reasons we shall see later related to the structures of the circuits to be applied, a slightly modified version of this encoding principle is used.

More precisely, given an information message with k bits, the associated polynomial of which is expressed as:

$$M(X) = m_0 + m_1 X + m_2 X^2 + \ldots + m_{k-1} X^{k-1}$$

Considering the factorization of $X^n + 1$ into polynomials $P_i(X)$ of degree $d_i$ in the two-element field GF(2):

$$P_i(X) = p_0^i + p_1^i X + \ldots + p_{d_i}^i X^{d_i}$$

To encode message M(X) in accordance with the invention, the message will be placed in the form of a code word with n bits consisting of s blocks $m_i(X)$ of size $d_i$, with i varying from 1 to s, s being the number of factorization polynomials $P_i(X)$. Polynomials $m_i(X)$ are obtained in accordance with the expression:

$$m_i(X) \equiv \overline{M(X)} A_i(X) \, [\overline{P_i(X)}] \tag{1}$$

In expression (1), the polynomial $A_i(X)$ is the reciprocal of the polynomial $P_i'(X)$, which is the derivative of polynomial $P_i(X)$:

$$A_i(X) = X^{d_i - 1} P_i'(X^{-1})$$

The coefficients of the s blocks $m_i(X)$ are hence transmitted, first of all undergoing on reception a decoding operation consisting in calculating a polynomial which is the sum of the information message transmitted $X^{n-k} M(X)$ and of an error syndrome. The latter is nil when there is no error in the transmission and the first $n-k$ coefficients of the obtained polynomial are nil, the last k coefficients representing the reconstituted message. If, on the other hand, errors did occur during transmission, the syndrome is non-nil and from the first $n-k$ coefficients the k correction coefficients to be added to the k most significant coefficients of the polynomial obtained are calculated, in order to return to the message bits.

More precisely, for each block received $m_i'(X)[m_i'(X) = m_i(X)$ if there is no error], the polynomial $S_i(X)$ is calculated such that:

$$S_i(X) = \overline{m_i'(X)} R_i(X) \text{ degree } n-1$$

with the following, depending on the convention of inscription adopted:

$$\overline{m_i'} = X^{d_i-1} m_i'(X^{-1})$$

and this is summed in order to obtain the polynomial:

$$S(X) = \sum_{i=1}^{s} S_i(X) = \sum_{i=1}^{s} \overline{m_i'(X)} R_i(X) \quad (2)$$

where $R_i(X)$ is a reconstitution polynomial equal to $$\frac{X^n + 1}{P_i(X)}$$

It can be considered that for each transmitted block $m_i(X)$, the following is received:

$$m_i'(X) = m_i(X) + E_i(X)$$

where $E_i(S)$ is the corresponding error polynomial, which is nil when there is no transmission error.

It can be proven that the following expression is obtained:

$$S(X) = \sum_{i=1}^{s} S_i(X) = X^{n-k} M(X) + \left[ \sum_{i \text{ erroneous}} \frac{F_i(X)}{P_i(X)} \right] (X^n + 1) \quad (3)$$

where the second sum $\epsilon$ is relevant only to the index i blocks containing errors and where the polynomial $F_i(X)$ is related to the error polynomial $E_i(X)$ by:

$$F_i(X) = X^{d_i-1} E_i(X^{-1})$$

In expression (3), the first term represents the useful information, whilst the second characterizes the errors introduced during transmission. The denominator of the second term $$\sigma_v(X) = \prod_{i \text{ erroneous}} P_i(X)$$

has a true degree $t_v$ lying between 0 and n depending on the erroneous blocks. The first $n-k = u$ coefficients of the useful term are nil and this brings us to make use of the algebraic decoding algorithm of Berlekamp to derive the second term from the first u coefficients of expression (3). This decoding yields a decoded polynomial $\sigma_d(X)$ of degree $t_d$. It is shown that, provided:

$$u \geq 2t_v = 2 \sum_{i \text{ erroneous}} d_i$$

we have $\sigma_d(X) = \sigma_v(X) = \sigma(X)$ and $t_v = t_d = t$ and one can then correctly identify the denominator. In what follows, it is assumed that this condition has been met.

It is then possible to reconstitute the coefficients of the powers u to $n-1$ of the second term of expression (3) for adding them modulo 2 to the corresponding coefficients of S(X) in order to reconstitute the corrected useful bits $m_0$ to $m_{k-1}$.

This reconstitution takes place as follows.

Given:

$$K(X) = (X^n + 1) \sum_{i \text{ erroneous}} \frac{F_i(X)}{P_i(X)} = \sum_{i=0}^{n-1} k_i X^i$$

where K(X) is termed the correction polynomial and:

$$H(X) = \sum_{i \text{ erroneous}} F_i(X) \left[ \prod_{\substack{j \neq i \\ j \text{ erroneous}}} P_j(X) \right]$$

with degree $H(X) \leq t_x - 1$, $t_x$ being the maximum degree authorized of polynomial $\sigma(X)$, we have the following expressions:

$$\sigma(X) K(X) = H(X)(X^n + 1)$$

$$\sigma(X) S(X) \equiv H(X) [X^u]$$

It can hence be concluded that the coefficients of the product $\sigma(X) S(X)$ are nil for the terms of degree u, $u+1, \ldots, n-1$, enabling the polynomial K(X) to be fully determined, the first u coefficients of which are defined by:

$$K(X) \equiv S(X) [X^u]$$

and the k most significant coefficients of which are given by the following expressions:

$$\sum_{m=0}^{t} \sigma_m \cdot k_{p-m} = 0 \quad \begin{array}{l} n - 1 \geq p \geq u \\ 2t \leq u \end{array} \quad (4)$$

where t is the effective degree of the polynomial $\sigma(X)$ and where $\sigma_m$ is the coefficient of rank m of polynomial $\sigma(X)$.

It can be noted that if the above hypothesis $2t \leq u$ is true, we have the following for $p = n, n+1, \ldots, n+u-1$:

$$k_p = s_{p-n}$$

where $k_p$ is the coefficient calculated in accordance with expression (4) and $s_{p-n}$ represents the coefficients of polynomial S(X). This is a possible solution for checking that the decoding operation has taken place correctly.

The principles of the transmission method in accordance with the invention having thus been explained, FIG. 1 represents a possible embodiment of the encoding device and the part of a decoding device calculating the polynomial S(X), such devices employing the above process.

As an example, to represent circuits of reasonable dimension, a value of 21 has been selected for n, which must be an odd number, although this value is not an optimum value and values such as 51 or 63, for instance, are preferable owing to the homogeneity of the factorization.

For n=21, breaking down into irreducible factors, we obtain:

$$P_1(X)=1+X$$

$$P_2(X)=1+X+X^2$$

$$P_3(X)=1+X+X^3$$

$$P_4(X)=1+X^2+X^3$$

$$P_5(X)=1+X+X^2+X^4+X^6$$

$$P_6(X)=1+X^2+X^4+X^5+X^6$$

The encoding device (FIG. 1) comprises computing circuits CR1 to CR6 formed by linear feedback registers, the principle of which is well known and is, for instance, described in the second edition of the work entitled "Error-correcting codes" by W. W. Peterson and E. J. Weldon, Jr., 1972, MIT Press, chapter 7. These registers comprise stages 101, 102–103, ..., 116 to 121, which are connected in series within each block, either directly or via modulo-2 adders, 130 to 141, which are exclusive OR gates.

In each block, the output from the final stage is looped back to the input of various stages via exclusive OR gates in accordance with a linear combination permitting the division of the polynomial, the coefficients of which are applied in decreasing order to the input of the register, by the polynomial, the coefficients of value 1 of which are associated to the effective feedback links.

Accordingly, in computing circuit CR6, the feedback links to the inputs of stages 116, 117, 118 and 120, and the output of stage 121 make it possible to divide by the polynomial $\overline{P_6(X)}$ which is the reciprocal of the polynomial $P_6(X)$. Likewise, computing circuits CR1 to CR5 respectively carry out the division by $\overline{P_1(X)}$, $\overline{P_2(X)}$, $\overline{P_3(X)}$, $\overline{P_4(X)}$ and $\overline{P_5(X)}$.

In addition, we know that in such registers, premultiplication can be carried out by applying the input coefficients to various points of the registers. Circuits CR1 to CR6 are designed to ensure premultiplication by polynomials $A_1(X)$ to $A_6(X)$ which are the reciprocals of the derived polynomials $P_1'(X)$ to $P_6'(X)$. In this way, the polynomial $P_3'(X)$ equals $1+X^2$ and its reciprocal is $X^2+1$. The input coefficients applied to input E1 are hence supplied to exclusive OR gate 132, which is the input of the first stage 104, to multiply by 1, and to exclusive OR gate 133, which is the input of the third stage 106, for multiplication by $X^2$. Likewise, the polynomial $P_6'(X)$ of maximum degree 5 equals $X^4$ and its reciprocal is X. Input E1 is hence linked to exclusive OR gate 139, which is the input of the second stage 117, for multiplication by X.

Lastly, the coefficients of the information message M(X) are applied in succession, in synchronism with a clock pulse controlling the encoding device as a whole, at input E1 in increasing order, i.e. $m_0$, then $m_1$ ... lastly $m_k$. By complying with this order, it is in fact polynomial M(X) that is applied to input E1. In the end, each computing circuit CRi hence carries out operations of multiplication by $A_i(X)$ and of division by $\overline{P_i(X)}$ of polynomial $\overline{M(X)}$. As soon as the final coefficient $m_k$ has been applied, we know that, in the stages of each register, coefficients of the remainder of the division of $\overline{M(X)}A_i(X)$ by polynomial $\overline{P_i(X)}$ are available. These coefficients are hence the coefficients of blocks $m_i(X)$ in accordance with expression (1). It is these coefficients which are transferred immediately with the following clock pulse into an output shift register 101' to 121'. This shift register then sends these coefficients of the various blocks $m_6(X)$ to $m_1(X)$ to a transmitter assembly 100 in decreasing order $m_5^6, m_4^6, \ldots, m_0^6, m_5^5, \ldots, m_0^1$.

The assembly 100 can transmit by radio or by any other type of link.

The transmitted signal is received by a receiver assembly 200 which extracts the coefficients of the blocks of the n-bit code word and sends them to an input shift register 201' to 221', with an output Sc, receiving coefficient $m_5^{6'}$ first. When the n coefficients of the code word have been entered into the input register, they are transferred in parallel into the register stages 201 to 221 forming with exclusive OR gates 230 to 238 computing circuits CR1' to CR6', respectively similar to circuits CR1 to CR6 of the encoding device, the linear feedback links in particular being identical. The outputs from these computing circuits are the outputs from their final stage. In these computing circuits, advantages are taken of the property that, when a linear feedback register is relooped in accordance with polynomial $\overline{P_i(X)}$ and a bit 1 is introduced at the input of this register, the successive coefficients of the polynomial $R_i(X)$ defined above are recovered at the output. By introducing into the register the coefficients of polynomial $m_i'(X)$, we hence obtain in succession at the output the coefficients of the polynomial $S_i(X)=\overline{m_i'(X)}R_i(X)$ in increasing order. Thanks to the transmission process and the type of code selected, the same registers with the same loops are used in the encoding device and the decoding device, which is of advantage in building circuits in integrated form.

The outputs of the various circuits Cr1' to CR6' are added by binary adders 240 to 243 to provide the successive coefficients of polynomial S(X) in increasing order, at output SR.

Figure 2:
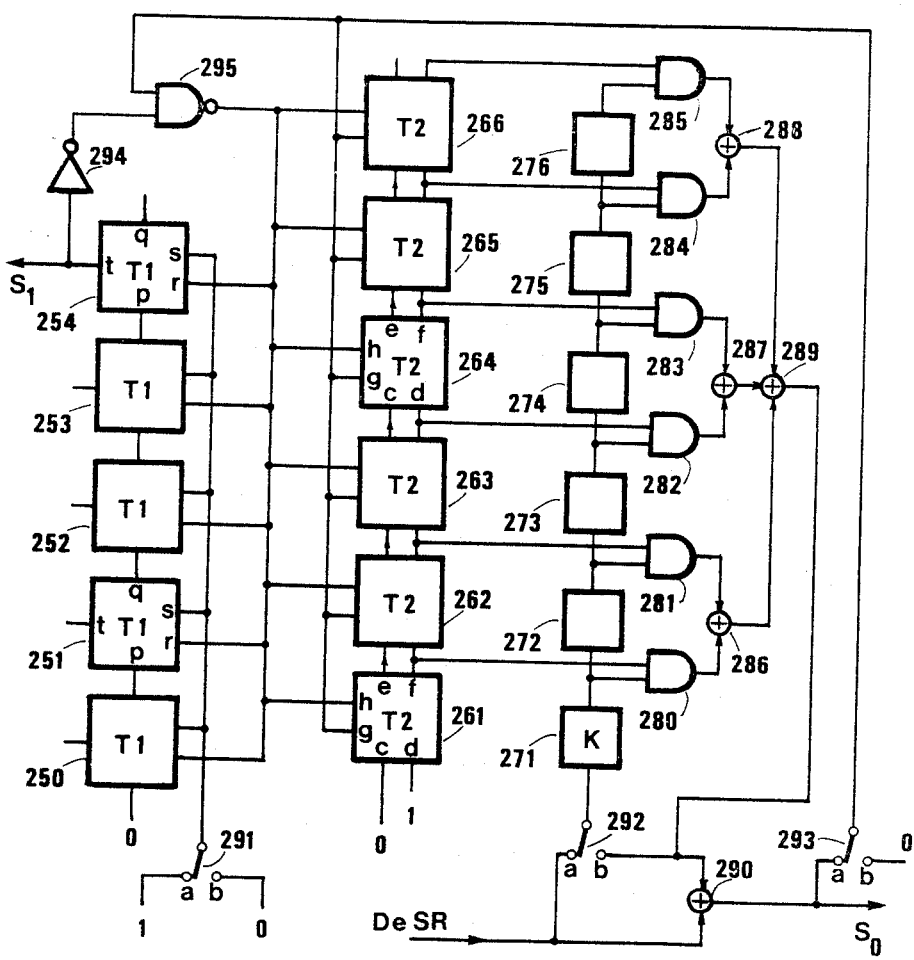
FIG. 2 is a diagram of the error detection and correction circuits in accordance with the invention.

FIG. 2 represents a diagram of an embodiment of the associated error detection and correction circuits of the decoding device in accordance with the invention.

In the example selected with n=21, we have taken k, the number of information bits or useful bits, as 9, and u, the number of redundancy or test bits, as 12 in consequence.

The circuits of FIG. 2 first enable the polynomial $\sigma(X)$ to be computed in accordance with an algebraic decoding algorithm of Berlekamp-Massey, modified with respect to initialization in order to obtain perfectly repetitive circuit structures.

The Berlekamp-Massey algorithm has, for example, been described in an article of J. L. Massey: "Shift-register synthesis and BCH decoding" which appeared in the IEEE Transactions on Information Theory, vol. IT-15, no. 1, January 1969, pages 122 to 127. This algorithm is intended to define the shortest linear feedback register of length L, enabling a finite sequence of N bits $s_j$ to be provided with feedback coefficients $c_i$ (i varying from 1 to L), such that:

$$s_j + \sum_{i=1}^{L} c_i s_{j-i} = 0 \; j \geq L$$

Now, computation of the polynomial $\sigma(X)$ from the first u coefficients $s_i$ of the polynomial $S(X)$ is of the same type. Consequently, the computing algorithm used is as follows. Given:

$$F = N - 2L$$

where N is the rank of the coefficient of $S(X)$ under processing, L having the above mentioned meaning. It is evident that for $N < 2L$, we have $F < 0$ and, for $N \geq 2L$, we have $F \geq 0$. This being so, substituting $\sigma'$ for B and $\sigma$ for C in the known algorithm, we obtain the following algorithm: (1) Initialization:

$$N = 0 \; L = 0 \text{ whence } F = 0$$

$$\sigma(X) = 1 \; (\sigma_0 \text{ always being equal to 1})$$

$$\sigma'(X) = 0 \; (\sigma_0' \text{ always being equal to 0})$$

(2) If $N \geq u$, go to (6). If not, calculate:

$$d_N = k_N \oplus \sum_{j=1}^{t_x} \sigma_j \cdot k_{N-j}$$

where
$t_x = u/2$ and
$k_N = s_N$ for $0 \leq N < u$ and
$k_N = 0$ for $N < 0$ (3) If $d_N = 0$ or $F < 0$, then:

$$\left. \begin{array}{l} X\sigma'(X) \rightarrow \sigma'(X) \\ \sigma(X) \oplus d_N \sigma'(X) \rightarrow \sigma(X) \end{array} \right\} \begin{array}{l} \text{for } i \geq 1 \\ \text{i.e.} \\ F + 1 \rightarrow F \\ \text{and go to 5)} \end{array} \left\{ \begin{array}{l} \sigma_i'^{(N+1)} \leftarrow \sigma_{i-1}'^{(N)} \\ \sigma_i^{(N+1)} \leftarrow \sigma_i^{(N)} \oplus d_N \sigma_i'^{(N)} \end{array} \right.$$

(4) If $d_N = 1$ and $F \geq 0$, then:

$$\left. \begin{array}{l} X\sigma(X) \rightarrow \sigma'(X) \\ \sigma(X) \oplus \sigma'(X) \rightarrow \sigma(X) \end{array} \right\} \begin{array}{l} \text{for } i \geq 1 \\ \text{i.e.} \\ -(F + 1) \rightarrow F \\ \text{and go to 5)} \end{array} \left\{ \begin{array}{l} \sigma_i'^{(N+1)} \leftarrow \sigma_{i-1}^{(N)} \\ \sigma_i^{(N+1)} \leftarrow \sigma_i^{(N)} \oplus \sigma_i'^{(N)} \end{array} \right.$$

(5) Replace N by N+1 and return to (2).
(6) If N=n, stop. If not, calculate:

$$\begin{array}{l} k_N = \sum_{j=1}^{t_x} \sigma_j \cdot k_{N-j} \\ \sigma(X) \rightarrow \sigma(X) \quad \text{i.e.} \quad \sigma_i^{(N+1)} \leftarrow \sigma_i^{(N)} \\ \sigma'(X) \text{ and } F \text{ are of any value} \end{array}$$

(7) Replace N by N+1 and return to (6).
Steps (1) to (5) correspond to calculation of the polynomial $$\sigma(X) = \pi_{i \text{ erroneous}} P_i(X)$$

during provision of the first u coefficients of the polynomial $S(X)$. Steps (6) and (7) then correspond to the error correction phase during provision of the last k coefficients of the polynomial $S(X)$, during which period the coefficients of polynomial $\sigma(X)$ previously computed must be retained in memory.

The diagram in FIG. 2 represents the circuits enabling this algorithm to be implemented and the error corrections to be made. These circuits comprise six identical cells, 261 to 266, which will be said of type T2, connected in series in order to calculate the coefficients of the polynomial $\sigma(X)$. Each cell T2 comprises two data inputs c, d, two data outputs e, f, and two control inputs g and h. The data outputs e, f are connected respectively to the inputs c, d of the following cell. The inputs c, d of the first cell respectively receive logic levels 0 and 1. Outputs f of cells 72 are sent respectively to AND gates 280 to 285, the other inputs of which are connected to the outputs of stages 271 to 276 of a shift register K. The products at the output from the AND gates are added by means of exclusive OR gates 286 to 289. The output from exclusive OR gate 289 is connected to an exclusive OR gate 290, also used as a binary adder and receiving, in addition, the coefficients of polynomial $S(X)$ provided at output SR. The output from this gate 290 forms output $S_0$ of the decoding device.

In addition, a controlled counter consisting of five identical cells, 250 to 254, which will be said of type T1, controls the binary computing unit of FIG. 2. Each cell T1 comprises an input p and an output q for serialization, a status output t, a blocking input s and a control input r. In addition to the counter, these control means comprise an inverter 294 connecting the status output t of the last stage of the counter to an input of a NAND gate 295, the output of which is connected to the control inputs r of the cells T1 and to the control inputs h of the cells T2. Input p of the first cell T1 is connected to logic level 0.

Lastly, control facilities comprising switches 291 to 293 are provided. Switch 291 connects the blocking inputs s of the cells T1 either to logic level 1 or logic level 0. Switch 292 connects the input of register K either to output SR providing the coefficients of polynomial $S(X)$, or to the output of exclusive OR gate 289. Switch 293 connects the other input of NAND gate 295 and the control inputs g of the cells T2, either to the output of adder 290 or to a logic level 0.

Figure 3:
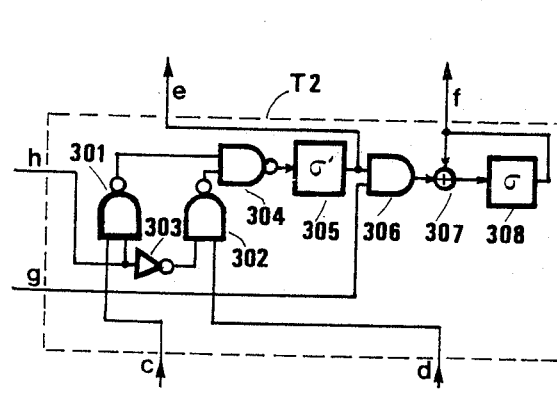
FIGS. 3 and 4 represent diagrams of cells used in the circuits of FIG. 2.
Figure 4:
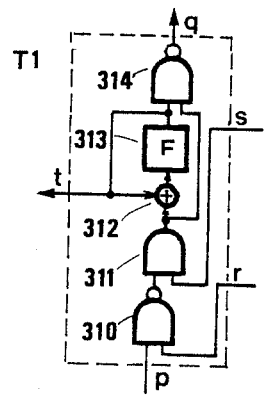

Before describing the operation of these circuits, we propose first of all to describe the composition of cells T1 and T2 is greater detail by referring to FIGS. 4 and 3. FIG. 3 shows cell T2 together with its inputs and outputs c to h. This cell comprises a stage 305 of a first shift register $\sigma'$ and a corresponding stage 308 of a second shift register $\sigma$. These stages are interconnected by logic circuits consisting of three NAND gates 301, 302 and 304, together with an inverter 303, forming a switch connecting the input of stage 305 to either of inputs c and d and controlled by control input h, and an AND gate 306, the inputs of which are connected respectively to the output of stage 305 and to control input g and the output of which is connected to the input of stage 308 via an exclusive OR gate 307, the other input of which is connected to the output from this stage 308. Outputs e and f of cell T2 consist of the outputs of stages 305 and 308 respectively. It is clear that, depending on whether input h is at logic level 1 or 0, the input of stage 305 is connected to data input c or data input d.

In addition, the output of stage 305 is connected to exclusive OR gate 307 which acts as an adder, or not, depending on whether input g receives logic level 1 or 0.

FIG. 4 shows cell T1 with its inputs and outputs p to t. This cell essentially comprises a stage 313 of register F of a binary counter counting in two's complement, i.e. the final stage contains the sign bit 0 for $F \geq 0$ and 1 for $F<0$. Each cell comprises a NAND gate 310, the inputs of which are connected to inputs p and r of the cell, an AND gate 311, the inputs of which are connected to the output of NAND gate 310 and to the blocking input s, an exclusive OR gate 312, the inputs of which are connected to the output of AND gate 311 and to the output of stage 313 and the output of which is connected to the input of this stage, and a NAND gate 314, the inputs of which are connected to the output of stage 313 and to the output of AND gate 311, and for which the output forms output q of the cell. The status output t of the cell consists of the output of stage 313. Clearly, when the blocking input s is at level 0, AND gate 311 only transmits a 0 level and stage 313 thus maintains its status with each clock pulse controlling this stage. If input s is at logic level 1, depending on whether control input r is at logic level 1 or 0, stage 313 adopts the status of input p (normal counting $F+1 \to F$) or the contents of stage 313 is inverted $[-(F+1) \to F]$, each stage 313 having one "Clear" input reset for initialization.

Following these details concerning cells T1 and T2, we can now indicate the operation of the circuits in FIG. 2. During the time the first u coefficients are provided by output SR, i.e. during the first u clock pulses, switches 291 to 293 are in position a. Cells T1 of the counter are released.

Outputs f of cells T2 provide the coefficients present in the second register $\sigma$ and register K receives in succession the coefficients $s_N$ of polynomial S(X). The AND gates 280 to 285 calculate the products and the exclusive OR gates 286 to 289 carry out the summing operations in order to obtain, at exclusive OR gate 289, $$\sum_{j=1}^{t_x} \sigma_j \cdot k_{N-j}$$

and, at the output from adder 290, since the wiring permanently sets $\sigma_0$ at 1, the value $$d_N = s_N \oplus \sum_{j=1}^{t_x} \sigma_j \cdot k_{N-j}.$$

The maximum value of t is $t_x = u/2 = 6$ if the number of errors is not greater than the number which can be tolerated for correction and there are hence size stages in register K and six cells T2. In addition, the number e of counter stages, since we are operating in two's complement, must be such that $2^e \geq 2u$. A value of five was hence chosen for e.

The value of $d_N$ is sent by switch 293 first to inputs g of cells T2 and, second, to the input of NAND gate 295. If $d_N=0$ or if $F<0$, i.e. the sign bit of the final stage 254 of the counter is 1, gate 295 puts out a level 1. If $d_N=1$ and $F \geq 0$, gate 295 puts out a level 0. Accordingly, all the circuits of FIG. 2 then operate in accordance with steps (1) and (5) of the algorithm indicated above. The value $d_N$ is also sent to output $S_0$ but is ignored. After the first u clock pulses, the sign bit in the counter must be 0 (positive number) if the number of errors to be corrected is not greater than the number which can be tolerated. This test is obtained at output $S_1$ of stage 254.

After provision of the first u coefficients, the phase of correction of the useful bits takes place. To do so, switches 291 to 293 are switched to position b. This blocks the countrol counter F by means of switch 291. Switch 293 applies a logic level 0 to inputs g of cells T2, enabling the coefficients of the polynomial $\sigma(X)$ obtained to be stored in memory in the second register $\sigma$ throughout the duration of this second phase. Lastly, switch 292 enables the output of exclusive OR gate 298 to be looped back to the input of the third register K. The product and sum circuits 280 to 289 then enable the most significant coefficients $k_i$ of the correction polynomial K(X) to be obtained in succession, in accordance with expression (4). These coefficients are added to the coefficients of corresponding weight of polynomial S(X) by binary adder 290, thus giving the corrected useful bits at output $S_0$.

An advantage of the decoding device in accordance with the invention is that input register 201' to 221' can be loaded (FIG. 1) with the blocks of the following code word, whilst the code word just received is being processed. We therefore have pipeline operation making for efficient use of each clock period throughout the decoding device without any loss of time.

In what precedes, only the case where the blocks received contained errors has been considered. However, one can also consider the case of erasures, i.e. that where certain blocks are not received through temporary "fading" of the transmission channel, or through a failure, or again as a result of a temporary rise in the noise level, or any other cause resulting in the disappearance of a certain number of blocks. These disappearances are detected at the reception assembly by any adequate known means (measurement of noise on the channel, additional parity bit indicating poor reception, etc . . . ).

To allow for these erasures, the simplest solution is instead of initializing registers $\sigma$ at 1, to initialize it with the polynomial:

$$\pi_{\substack{i \\ \text{erased}}} P_i(X)$$

which is the product of the polynomials $P_i(X)$ corresponding to the blocks erased. To perform such a product, for each polynomial $P_i(X)$ we must carry out an operation $\sigma(X) \leftarrow \sigma(X) \, P_i(X)$, i.e. $d_i+1$ operations of the shift type, and then add the initial $\sigma(X)$. To do so, one can use the circuits enabling the algebraic decoding algorithm already described to be implemented. These circuits in fact enable operations of the following type to be carried out:

$$\text{I} \begin{cases} \sigma(X) \oplus d\sigma'(X) \to \sigma(X) \\ X\sigma'(X) \to \sigma'(X) \end{cases}$$

$$\text{II} \begin{cases} \sigma(X) \oplus \sigma'(X) \to \sigma(X) \\ X\sigma(X) \to \sigma'(X) \end{cases}$$

If a polynomial $P_i(X)$ be considered, such that:

$$P_i(X) = 1 + p_1{}^i X + p_2{}^i X + \ldots + p_{d_i-1}{}^j X^{d_i-1} + X^{d_i}$$

since coefficient $p_0{}^i$ and $p_{d_i}{}^j$ are always equalling 1, in order to make the multiplication $\sigma(X) P_i(X)$, $d_i - 1$ operations of the type I must be carried out, with the values of coefficients $p_1{}^i$ to $p_{d_i-1}{}^j$ adopted for the successive values of d and then the following operation:

$$\text{III} \begin{cases} \sigma(X) \oplus \sigma'(X) \to \sigma(X) \\ X[\sigma(X) \oplus \sigma'(X)] \to \sigma'(X) \end{cases}$$

The first line of operation III corresponds to multiplication with coefficient $p_{d_i}{}^j$, which is always equal to 1, and the second line corresponds to initialization of register $\sigma'$ for the operation with the following polynomial $p_{i+1}(X)$ which always has its coefficient $p_0{}^i$ equal to 1.

Accordingly, multiplication by polynomial $p_i(X)$ takes $d_i$ cycles, which is advantageous, since it equals the number $d_i$ of bits actually considered.

All this assumes that at the beginning of processing, $\sigma(X)$ is initialized to 1, which is already the case in the algorithm used in conjunction with the circuits of FIG. 2, and also that $\sigma'(X)$ is initialized at X, which can easily be brought about by initializing stage 305 of the first cell T2 at 1 (for example by the "Preset" input).

After $\underline{\alpha}$ cycles, if $\underline{\alpha}$ is the degree of the polynomial $$\sigma_{eff} = \pi_{\substack{i \\ \text{erased}}} P_i(X),$$

in the second register we therefore have available polynomial $\sigma_{eff}$ to start decoding in accordance with the algorithm already described. The first phase of this decoding will therefore have $\underline{\alpha}$ cycles cut off, $\underline{\alpha}$ equalling at the most u, which is the maximum tolerable for the erasures. The first register $\sigma'$ will be initialized at $X\sigma_{eff}$ for decoding, by the final type III operation, which ensures correct execution of the decoding algorithm already described.

Naturally, all this assumes that it is possible to provide coefficients of the polynomials $P_i(X)$ erased and that the decoding circuits are capable of carrying out not only type I and II operations, which is the case of the circuits of FIG. 2, but also type III operations.

Figure 5:
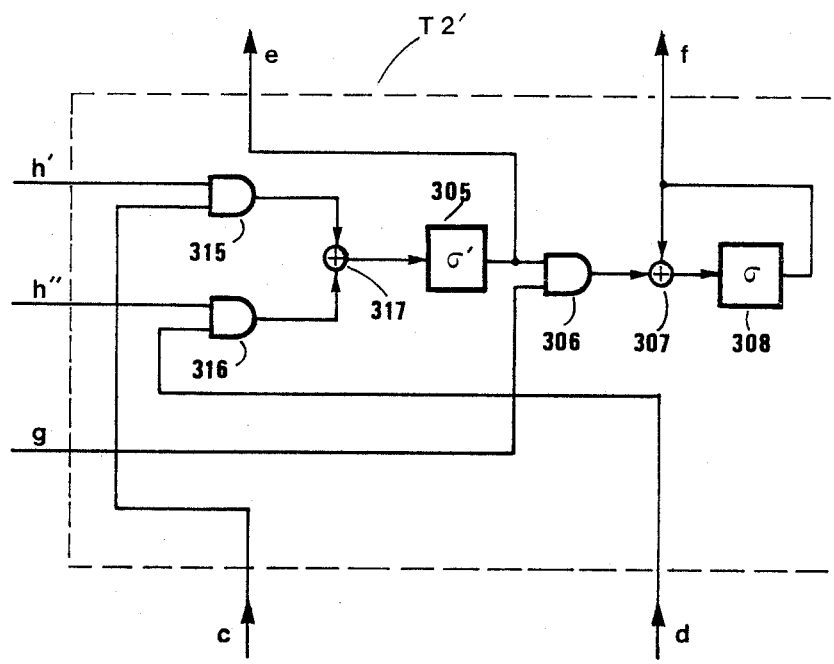
FIG. 5 is a diagram of a cell modified for processing erasures.

FIG. 5 represents the diagram of a cell T2' which can replace cells T2 of FIG. 2 and is capable of carrying out all three operations I, II and III. This cell T2' still comprises the data inputs c, d, the data outputs e, f, the control input g and elements 305 to 308. However, the switch feeding the input of stage 305 is replaced by a three-position switch comprising two AND gates 315 and 316, each with one input connected respectively to inputs c and d, and another input connected respectively to two control inputs h' and h" of the cell, and one exclusive OR gate 317 providing the modulo-2 sum of the outputs of AND gates 315 and 316 at the input of stage 305 of register $\sigma$. Depending on the values of the logic levels at inputs g, h' and h", cell T2' enables the following operations to be carried out:

$$\text{I} \begin{cases} g = d \\ h' = 1 \\ h'' = 0 \end{cases} \text{II} \begin{cases} g = 1 \\ h' = 0 \\ h'' = 1 \end{cases} \text{III} \begin{cases} g = 1 \\ h' = 1 \\ h'' = 1 \end{cases}$$

Figure 6:
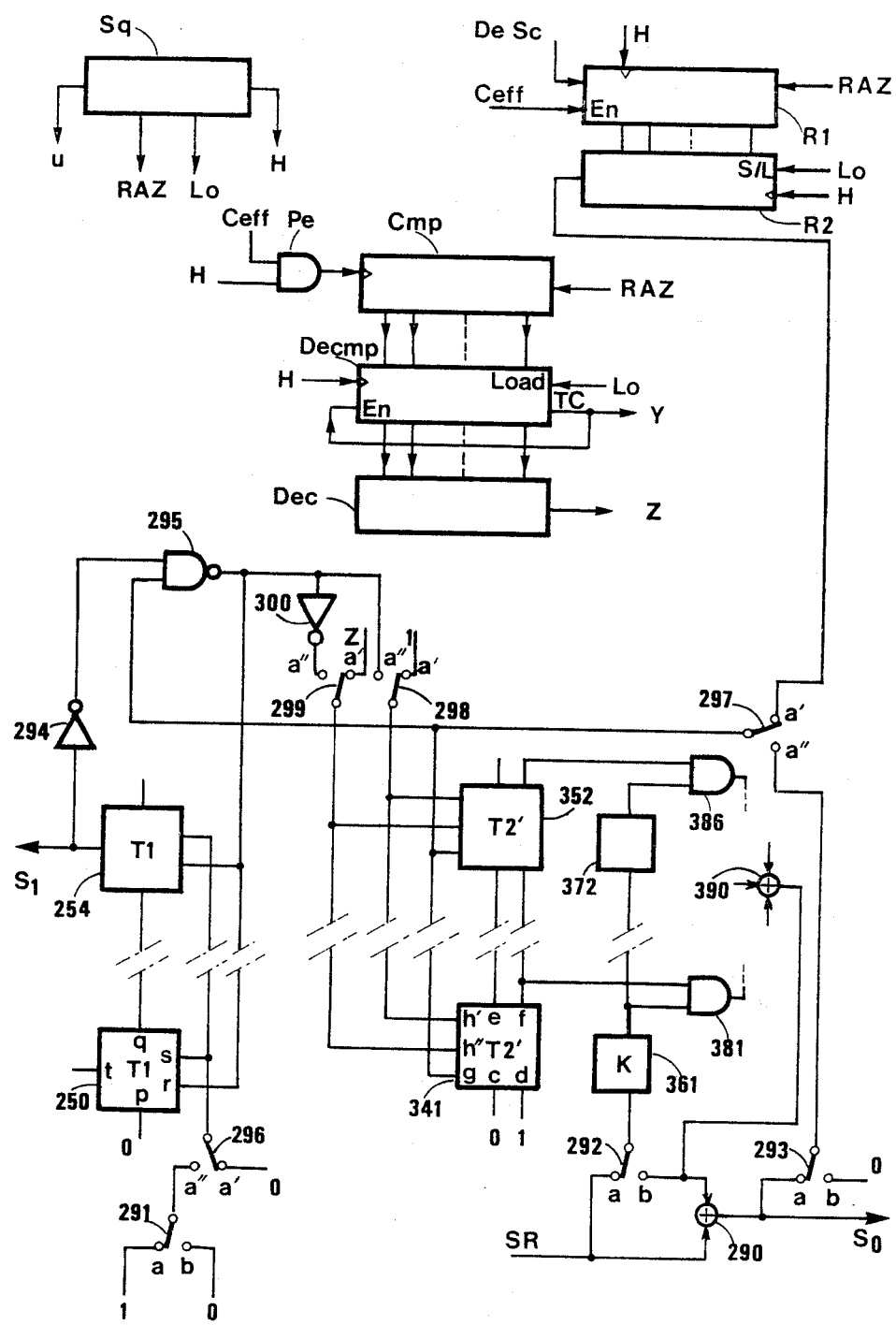
FIG. 6 is a diagram for error detection and correction circuits in accordance with FIG. 2, adapted for processing also erasures.

FIG. 6 is a diagram of the error detection and correction circuits and the erasure processing circuits in accordance with the invention. It again features the binary computing unit of FIG. 2 with the counter using cells T1, the cells T2', 341 to 352, replacing the cells T2, register K, 361 to 372, binary multiplying and summing circuits 381 to 390, adder 290, inverter 294 and NAND gate 295 and control switches 291 to 293. u cells T2' are used and u stages of register K instead of u/2 in the case of FIG. 2. Additional control switches 296 to 299, together with an inverter 300, are first added. Switch 296 connects the blocking inputs s of cells T1 to a blocking 0 logic level or to switch 291. Switch 297 connects the inputs g of the cells T2' and an input of NAND gate 295 either to storage circuits R1, R2 of the coefficients of polynomials $P_i(X)$ corresponding to the blocks erased, or to switch 293. Switch 298 connects the control inputs h' of the cells T2' either to a logic level 1 or to the output of NAND gate 295. Switch 299 connects the control inputs h" of the cells T2' either to an input receiving a control signal Z or, via an inverter 300, to the output of NAND gate 295. Lastly, additional control circuits are provided comprising an AND gate Pe, a counter Cmp, a down-counter Decmp, a decoder Dec and a sequencer Sq, supplying the time signals H, Lo, RAZ and u. Counter Cmp has a counting input receiving the clock pulses H via AND gate Pe, the other input of which receives a control signal Ceff and a reset input receiving the signal RAZ. The outputs of the counter are connected to the loading inputs of down-counter Decmp, which possesses a down-counting input receiving the clock pulses H, a load control input "Load" receiving signal Lo, a terminal count output TC for down-counting providing a first control signal Y which changes value when the down-counter reaches zero status and an enable input En connected to output TC. The bit outputs from the down-counter are connected to the inputs of a decoder Dec, the output of which provides a second control signal Z adopting logic level 1 when the down-counter reaches certain values.

Overall operation will be described by assuming that, before the beginning of the reception of each code word, the input register 201' to 221' (FIG. 1) is loaded with the coefficients $p_1{}^i$ to $P_{d_i}{}^i$ of each of the polynomials $P_i(X)$ for instance by means of adequate hard-wiring of the "Preset" and "Clear" inputs of the input register. In this way, stage 201' will contain the coefficient $p_1{}^1$, . . . , and stages 216' to 221' will contain coefficients $p_1{}^6$ to $p_6{}^6$. When the coefficients of the blocks $m_i{}'(X)$ from the assembly 200 start to be received, at the same time as they are entered into the input register, the latter restores at its output Sc the coefficients of the polynomial $P_i(X)$ corresponding to the block received, in decreasing order. Furthermore, at the same time as reception assembly 200 must send to the input register a block $m_i'(X)$, it provides a signal Ceff indicating whether the block is erased. The input of shift register R1 (FIG. 6) is connected to output Sc. This shift right register, which has a size equal to u, is shifted in synchronism with the main clock pulse H when enabled to do so by applying signal Ceff to the enable input En. Accordingly, this register stores the coefficients of polynomials $P_i(X)$ provided by output Sc only when signal Ceff informs it that an erased block is now being received. On completion of entry into memory in the input register of the s blocks $m_i'(X)$, sequencer Sq first provides a signal Lo, applied to input S/L of shift register R2 and which enables loading of the contents of register R1 into register R2 (as well as, moreover, the transfer from the input register to computing circuits CR1' to CR6'), then a reset signal RAZ in particular for resetting register R1, which is thus ready for reception of the following code word. Shift left register R2, which has a size capacity u, enables the coefficients of the polynomials $P_i(X)$ corresponding to the erased blocks to be restored in succession, in increasing order.

As we shall see later, the sizes of the polynomials of the factorization of $X^n + 1$ actually used can always be equalized and thus the control circuits have been described for this simplified case in which all the polynomials $P_i(X)$ are of the same degree.

Counter Cmp counts the clock pulses H sent by gate Pe during each erased block under control of signal Ceff. On completion of reception of a code word, its contents equals the number of coefficients recorded in register R1. This contents is loaded into down-counter Decmp, the load control input of which receives signal Lo, after which counter Cmp is reset to zero by signal RAZ for reception of the following word. As the coefficients are restored by register R2, the down-counter counts down the clock pulses H until it reaches zero, corresponding to restoration of the last coefficient contained in register R2. Output TC of the downcounter then provides a signal Y which blocks the down-counter until a new value is loaded. While down-counter Decmp is counting down the pulses, its bit outputs are decoded by decoder Dec which provides a control pulse Z each time the contents of the down-counter equals a multiple of the degree of the polynomials $P_i(X)$.

This being so, switches 296 to 299 are set to position a" as long as signal Y indicating the end of down-counting is absent. This blocks counter F during the erasure processing period, enables the coefficients provided by register R2 to be substituted for the values $d_N$ and applies a logic level 1 to the control inputs h' of the cells T2' and signal Z to the inputs h". As long as signal Z is at 0, the cells T2' carry out type I operations and, with each last coefficient of a polynomial $P_i(X)$ corresponding to a block erased, signal Z controls a type III operation by going to status 1.

As soon as signal Y indicating the end of the computation phase of polynomial $\sigma_{eff}$ appears, it controls setting of switches 296 to 299 into position a" and we now revert to operation similar to that of the decoding device in FIG. 2, with the control inputs h' and h" of the cells T2' connected to the output of NAND gate 295 directly and via inverter 300, so that only operations of type I or type II are executed.

As it has already been stated, one can generally always come down to the case of polynomials $P_i(X)$ of the same size by grouping certain lower degree polynomials to bring the degree of breakdown factors of $X^n + 1$ to the maximum degree of the polynomials $P_i(X)$. For instance, for n=63, the factorization gives nine polynomials ($P_5$ to $P_{13}$) of the 6th degree, two ($P_3$ and $P_4$) of the 3rd degree, one ($P_2$) of the 2nd degree and one ($P_1$) of the 1st degree. One can accordingly group together either product $P_3P_4$ or product $P_1P_2P_3$ in order to obtain an additional 6th degree polynomial. At least one polynomial always remains which does not have the same degree as the others. The simplest solution consists in eliminating it by means of a coding ensuring that the corresponding block is invariably nil, thus preventing it from being sent. To do so, it suffices to add to message M(X) additional bits calculated so that the resultant message thus completed is a multiple of the polynomial $\overline{P_j}$ to be eliminated. To do so, a remainder calculation is made in accordance with the following relationship:

$$R(X) \equiv \overline{M(X)} \ [P_{j\ elim}]$$

and this remainder is added after M(X). This calculation is made in a conventional way with a looped register, in order to carry out the division by $\overline{P_{j\ elim}}$.

The embodiments described so far, based on a binary decoding algorithm very similar to the Beriekamp-Massey algorithm, require the calculation with each cycle of a quantity $$\sum_{j=1}^{t} \sigma_j \cdot k_{N-j}$$

and the results are awaited to continue the calculation. Now, this summing of products is carried out by means of adders connected together to form a "tree", hence considerably reducing the processing speed since, because the result is used for the remainder of the calculations owing to a feedback link, pipeline type operation cannot be adopted.

In accordance with one characteristic of the invention, a new algorithm has hence been developed, derived from the previous one, and distinguished from it in particular by the fact that coefficients $s_N$ of polynomial S(X) are distributed to all the cells. Adopting similar notations and four shift registers $\sigma'$, $\sigma$, q' and q, the following algorithm is used:
(where $1 \leq i \leq u$ for determination of new values of $\sigma$ and $\sigma'$ and $0 \leq i \leq u-1$ for determination of new values of q and q')

(1) Initialization $$N = 0 \ L = 0 \text{ whence } F = 0 \quad \sigma(X) = 1 \quad \sigma'(X) = 0$$
$$q'(X) = 0 \quad q(X) = 0$$

(2) If $N \geq u$, go to (7). If not, calculate:

$$d_N = s_N \oplus q_0^{(N)}$$

(3) If $d_N = 0$, then:

$$\left. \begin{array}{l} X\sigma'(X) \rightarrow \sigma'(X) \\ \sigma(X) \rightarrow \sigma(X) \\ q'(X) \oplus s_N \ \sigma'(X) \rightarrow q'(X) \\ [q(X) \oplus s_N \ \sigma(X)]X^{-1} \rightarrow q(X) \end{array} \right\} \text{ i.e. } \left\{ \begin{array}{l} \sigma_i'^{(N+1)} \leftarrow \sigma_{i-1}'^{(N)} \\ \sigma_i^{(N+1)} \leftarrow \sigma_i^{(N)} \\ q_i'^{(N+1)} \leftarrow q_i'^{(N)} \oplus s_N \ \sigma_i'^{(N)} \\ q_i^{(N+1)} \leftarrow q_{i+1}^{(N)} \oplus s_N \ \sigma_{i+1}^{(N)} \end{array} \right.$$

$$F + 1 \rightarrow F$$

-continued and go to 6)

(4) If $d_N=1$ and $F<0$, then:

$$\left.\begin{array}{l}X\sigma'(X) \rightarrow \sigma'(X)\\ \sigma(X) \oplus \sigma'(X) \rightarrow \sigma(X)\\ q'(X) \oplus s_N \sigma'(X) \rightarrow q'(X)\end{array}\right\} \text{i.e.} \left\{\begin{array}{l}\sigma_i'^{(N+1)} \leftarrow \sigma_{i-1}'^{(N)}\\ \sigma_i^{(N+1)} \leftarrow \sigma_i^{(N)} \oplus \sigma_i'^{(N)}\\ q_i'^{(N+1)} \leftarrow q_i'^{(N)} \oplus s_N \sigma_i'^{(N)}\end{array}\right.$$

$$[q(X) \oplus s_N \sigma(X)]X^{-1} \oplus [q'(X) \oplus s_N \sigma'(X)]X^{-1} \rightarrow q(X)$$
$$\text{i.e. } q_i^{(N+1)} \leftarrow q_{i+1}^{(N)} \oplus s_N \sigma_{i+1}^{(N)} \oplus q_{i+1}'^{(N)} \oplus s_N \sigma_{i+1}'^{(N)}$$

$$F + 1 \rightarrow F$$

and go to 6)

(5) If $d_N=1$ and $F\geq 0$, then:

$$\left.\begin{array}{l}X\sigma(X) \rightarrow \sigma'(X)\\ \sigma(X) \oplus \sigma'(X) \rightarrow \sigma(X)\\ q(X) \oplus s_N \sigma(X) \rightarrow q'(X)\end{array}\right\} \text{i.e.} \left\{\begin{array}{l}\sigma_i'^{(N+1)} \leftarrow \sigma_{i-1}^{(N)}\\ \sigma_i^{(N+1)} \leftarrow \sigma_i^{(N)} \oplus \sigma_i'^{(N)}\\ q_i'^{(N+1)} \leftarrow q_i^{(N)} \oplus s_N \sigma_i^{(N)}\end{array}\right.$$

$$[q(X) \oplus s_N \sigma(X)]X^{-1} \oplus [q'(X) \oplus s_N \sigma'(X)]X^{-1} \rightarrow q(X)$$
$$\text{i.e. } q_i^{(N+1)} \leftarrow q_{i+1}^{(N)} \oplus s_N \sigma_{i+1}^{(N)} \oplus q_{i+1}'^{(N)} \oplus s_N \sigma_{i+1}'^{(N)}$$

$$-(F + 1) \rightarrow F$$

and go to 6)

(6) Replace N by N+1 and return to (2)
(7) If N=n, stop. If not:

$$k_N = q_0^{(N)}$$

$$\left.\begin{array}{l}\sigma(X) \rightarrow \sigma(X)\\ [q(X) \oplus k_N \sigma(X)]X^{-1} \rightarrow q(x)\end{array}\right\} \text{i.e.} \left\{\begin{array}{l}\sigma_i^{(N+1)} \leftarrow \sigma_i^{(N)}\\ q_i^{(N+1)} \leftarrow q_{i+1}^{(N)} \oplus k_N \sigma_{i+1}^{(N)}\end{array}\right.$$

$\sigma'(X)$, $q'(X)$ and $F$ of any value and go to 8)

(8) Replace N by N+1 and return to (7).

Just as in the algorithm previously used, the first steps (1) to (6) correspond to calculation of the polynomial $$\sigma(X) = \underset{i \text{ erroneous}}{\pi} P_i(X)$$

during provision of the first u coefficients of the polynomial S(X). Steps (7) to (8) then correspond to the error correction phase during provision of the last k coefficients of polynomial S(X), during which period the coefficients of the polynomial $\sigma(X)$ previously calculated must be held in memory.

Figure 7:
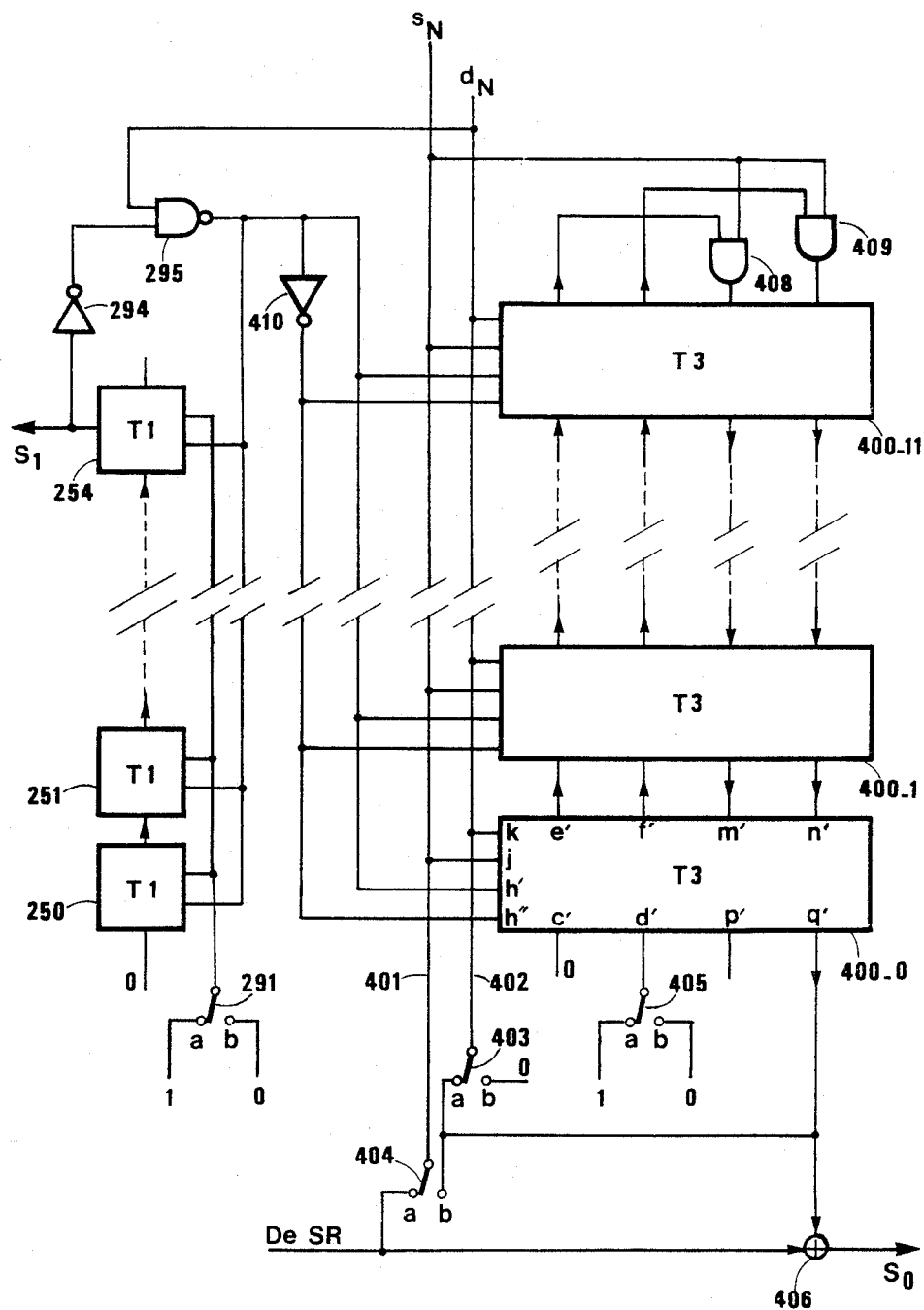
FIG. 7 represents the diagram of error detection and correction circuits in accordance with the invention, operating according to a modified algorithm.
Figure 8:
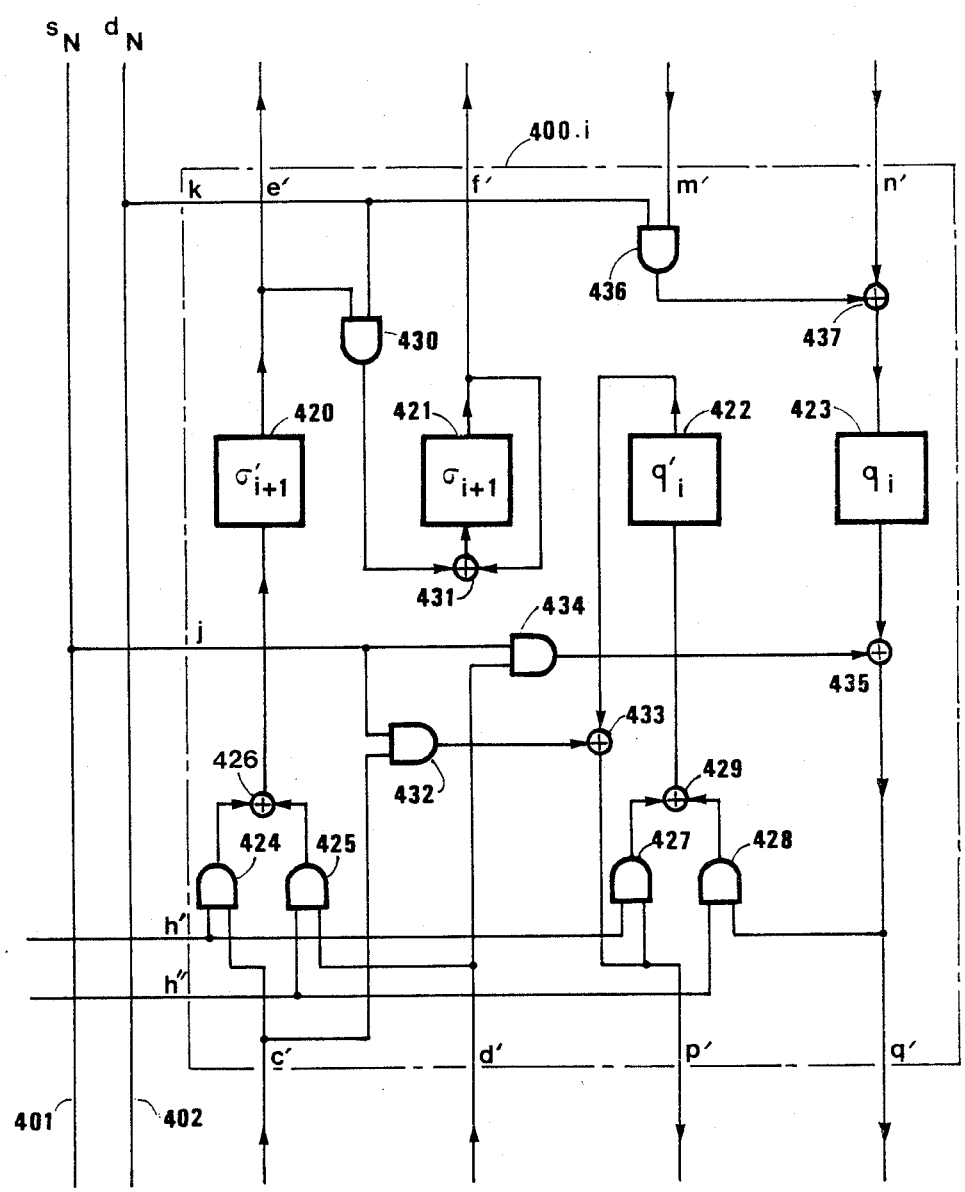
FIG. 8 is the diagram of a cell used in the circuits of FIG. 7.

The diagram of FIG. 7 represents the circuits for applying this new algorithm and making error and erasure corrections. These circuits comprise u=12 identical cells, 400.0 to 400.11, that will be said of type T3, in cascade configuration. One cell of this type, 400.i, is shown in FIG. 8. It comprises four stages, 420 to 423, respectively belonging to four registers, $\sigma'$, $\pi$, q' and q. The four stages do not have the same rank. Stages 422 and 423 have rank i and stages 420 and 421 rank i+1. i varies from 0 to u−1. Cell T3 comprises a first group of two data inputs c', d' and two data outputs e', f', a second group of two data inputs m', n' and two data outputs p', q', two control inputs h', h" and two coefficient inputs j, k. The inputs of stages 420 and 422 are each connected to the output of a three-position switch of the same type as that used in cell T2' of FIG. 5. The switch connected to stage 420 comprises two AND gates 424, 425 and one exclusive OR gate 426, providing stage 20 either with the data present at input c', or the data present at input d', or the modulo-2 sum of the data at the two inputs, depending on the logic levels present at control inputs h' and h". The switch connected to stage 422 comprises two AND gates 427, 428 and one exclusive OR gate 429, and provides stage 422 either with the data present at the output of an exclusive OR gate 433, or the data present at output q' of the cell, or the modulo-2 sum of the data at both inputs of the switch, depending on the logic levels present at control inputs h' and h". The output of exclusive OR gate 433 is also connected to output p' of the cell, whereas its inputs are connected to the output of stage 422 and to the output of an AND gate 432, the inputs of which are connected respectively to inputs c' and j of the cell. The output of stage 423 is connected to the output q' via an exclusive OR gate 435, the other input of which is connected to an AND gate 434. This AND gate has its inputs connected respectively to inputs d' and j of the cell. The input of stage 421 receives the output of an exclusive OR gate 431, the inputs of which are connected respectively to the output of stage 421 and to the output of an AND gate 430, the inputs of which are connected to input k and to output e' of the cell, this output e' itself being connected to the output of stage 420. Input n' of the cell is connected to the input of stage 423 via an exclusive OR gate 437, the other input of which receives the output of an AND gate 436. This AND gate has its inputs connected to inputs m' and k of the cell. Lastly, output f' of the cell consists of the output of stage 421.

Returning to FIG. 7, it can be seen that the cells T3 are connected together so that the outputs e', f' of the first group of a cell are connected to inputs c', d' of the first group of the following cell, whilst outputs p', q' of the second group of this following cell are connected to inputs m', n' of the second group of the cell concerned.

In addition, input c' of the first cell T3, 400.0, is at logic level 0, input d' of this cell is linked by a control switch 405 either to level 1 during supply of the first u coefficient of S(X), or to level 0 during the remainder of the time, whereas output q' of this initial cell is linked to the input of a binary adder 406 (exclusive OR gate), the output of which forms the output $S_0$ of the decoding device and the other input of which receives the coefficients $s_N$ of the polynomial S(X) provided by output SR (FIG. 1). In addition, two distribution lines 401 and 402, connected respectively to all the inputs j and all the inputs k of the cells T3 are provided. During the first phase of calculation of $\sigma(X)$, i.e. during provision of the first u coefficients of S(X), line 401 receives the coefficients $s_N$ via a switch 404 and line 402 receives the calculated coefficients $d_N$ of output q' of the first cell via switch 403. Outputs e', f' of the last cell T3, 400.11, are looped back to inputs m', n' of this cell via AND gates 408, 409, the other inputs of which are connected to the distribution line 401.

In addition, the circuits of FIG. 7, just like those of FIG. 2, comprise counter F consisting of cells T1, 250 to 254, the blocking inputs s of which are connected to switch 291 and the status output t of the final stage 254 of which is connected via inverter 294 to NAND gate 295, the other input of this gate being connected to distribution line 402. The output of gate 295 is always connected to the control inputs r of the cells T1 and also directly connected to the inputs h' of the cells T3 and via inverter 410 to the inputs h" of these cells T3. During provision of the first u coefficients of the polynomial S(X), switches 291 and 403 to 405 are in the position a and the circuits operate in accordance with steps (1) to (6) of the new algorithm described. During provision of the following k most significant coefficients, switches 291 and 403 to 405 adopt the position b. Counter F is blocked, the second distribution line 402 receives a logic level 0 and the first distribution line 401 receives the coefficients $d_N$ instead of coefficients $s_N$, whereas output $S_0$ provides the corrected useful bits of the message M(X), all in accordance with steps (7) and (8) of the new algorithm.

It is evident that, just as for the circuits of FIG. 2, those of FIG. 7 can be adapted to processing of erasures by adding additional control circuits identical to those of FIG. 6, all the more readily, when the cells T3 are already equipped with three-position switches. Just as in the case of FIG. 6, $\sigma(X)$ must be initialized at 1 and $\sigma'(X)$ must be initialized at X.

One of the obvious advantages of the new algorithm is that it replaces the problem of the transit time in the multiplication and sum arborescent binary circuits with u inputs by a distribution problem to u cells of coefficients $d_N$ and $s_N$, which is recognized as a problem that is distinctly simpler to solve, thus making for very considerable increase to the processing speed, even with very long code words.

While the invention has been described in connection with what is presently considered to be the most practical and preferred embodiments, it is to be understood that the invention is not to be limited to the disclosed embodiments but, on the contrary, is intended to cover various modifications and equivalent arrangements included within the spirit and scope of the appended claims, which scope is to be accorded the broadest interpretation so as to encompass all such modifications and equivalent structures.

I claim:

1. A method of transmission of information messages with k bits which corrects bursts of errors by means of code words with n bits forming s blocks of size $d_i$ where i varies from 1 to s, s being a number of polynomials $P_i(X)$ resulting from a factorization of $X^n+1$ over a field GF(2) with two elements, and $d_i$ being a degree of the polynomial $P_i(X)$, said method comprising the steps of:

(a) on transmission:
    calculating, for each block consisting of coefficients of a polynomial $m_i(X)$, a product of (1) the polynomial $\overline{M(X)}$, which is the reciprocal of the polynomial M(X) of degree $\leq k-1$ associated to the message to be transmitted, by (2) a polynomial $A_i(X)$, which is the reciprocal of the polynomial $P_i'(X)$ which is a derivative of said polynomial $P_i(X)$;
    dividing said product by a polynomial $\overline{P_i(X)}$ and adopting a remainder of said division as coefficients of the polynomial $m_i(X)$, in accordance with the relationship $$m_i(X) \equiv \overline{M(X)} A_i(X) [\overline{P_i(X)}]$$

said coefficients forming the bits of the corresponding block transmitted; and, (b) on reception:
    calculating, for each block received, a polynomial $S_i(X)$ with n coefficients, which is the product of (a) a polynomial $\overline{m_i'(X)} = X^{d_i-1} m_i'(X^{-1})$, which is the reciprocal of the polynomial $m_i'(X)$ associated to the block received, by a reconstitution polynomial $$R_i(X) = \frac{X^n + 1}{P_i(X)},$$

a sum of said n coefficients of said polynomial $S_i(X)$ representing a superimposition of the message transmitted $X^{n-k} \cdot M(X)$ and an error syndrome;
    determining, by means of a first n−k coefficients of said sum of said n coefficients of said polynomial $S_i(X)$, coefficients of a polynomial $\sigma(X)$, which is the product of the polynomials $P_i(X)$ corresponding to the erroneous blocks i;
    calculating the k most significant coefficients of a correction polynomial K(X) such that:

$$K(X) = \sum_{j=1}^{s} s_j(X) [X^{n-k}]$$

and $\sum_{m=0}^{t_x} \sigma_m \cdot k_{p-m} = 0$ for $n-1 \geq p \geq n-k$ $\sigma_m$ representing the coefficients of said polynomial $\sigma(X)$ of maximum degree $t_x$ authorized for a valid correction, and $k_{p-m}$ representing coefficients of said polynomial K(X), and
    summing each of said k most significant coefficients of said polynomial K(X) with the coefficients of the same significance of said sum of the polynomial $S_i(X)$ in order to obtain k corrected bits of the message received.

2. A method according to claim 1 wherein the step of determining said polynomial $\sigma(X)$ uses a variant of an algebraic decoding algorithm of the Berlekamp-Massey type.

3. An encoding device for a system of transmission which corrects bursts of errors of information messages with k bits, by means of code words with n bits forming s blocks of size $d_i$, where i varies from 1 to s, s being the number of polynomials $P_i(X)$ resulting from the factorization of $X^n+1$ over the field GF(2) with two elements and $d_i$ being the degree of polynomial $P_i(X)$, said encoding device comprising:

s computing circuits for respectively computing s blocks to be transmitted, each of said circuits consisting of a linear feedback register which receives at predetermined inputs said k bits of the message in order, said predetermined inputs being arranged in such a way as to ensure premultiplication by a polynomial $A_i(X)$, reciprocal of a polynomial $P_i'(X)$ which is the derivative of the polynomial $P_i(X)$ associated with the considered computing circuit, the feedback connections of each of said linear feedback registers being arranged so as to carry out division by the polynominal $\overline{P_i(X)}$, reciprocal of the associated polynomial $P_i(X)$, and extraction means for extracting from said linear feedback registers the n bits of the code word to be transmitted which are present in said registers as soon as the last bit of said message has been introduced in said computing circuits.

4. A decoding device with error correction for receiving information messages with k bits transmitted by means of code words with n bits forming s blocks of size $d_i$, where i varies from 1 to s, s being a number of polynomials $P_i(X)$ resulting from the factorization of $X^n + 1$ over the field GF(2) with two elements and $d_i$ being the degree of the polynomial $P_i(X)$, the bits of each of said blocks being the coefficients of respective polynomials $m_i(X)$ such that:

$$m_i(X) \equiv M(X) A_i(X) \ [P_i(X)]$$

where $M(X)$ is the reciprocal of the polynomial $M(X)$ of degree $\leq k-1$ associated to the transmitted message and $A_i(X)$ is the reciprocal of the polynomial $P_i'(X)$ which is the derivative of the polynomial $P_i(X)$, said decoding device comprising:

s computing circuits and means for transferring to each computing circuit respectively the s blocks received, having $m_i'(X)$ associated polynomials, in order to calculate the coefficients of respective polynomials $S_i(X)$ in accordance with the relationship:

$$S_i(X) = \overline{m_i'(X)} \ R_i(X)$$

where $\overline{m_i'(X)}$ is a reciprocal polynomial of the polynomial $m_i'(X)$ and where $$R_i(X) = \frac{X^n + 1}{P_i(X)}$$

is the reconstitution polynomial, said s computing circuits each including a linear feedback register, the feedback connections of which are arranged so as to divide by the polynomial $\overline{P_i(X)}$, the reciprocal of the polynomial $P_i(X)$;

adding means for summing all said respective polynomials $S_i(X)$ to form a sum polynomial;

a binary computing unit for implementing a Berlekamp-Massey alegbraic decoding algorithm and including a first shift register and a second shift register, logic circuits for interconnecting said first and second shift registers, a third shift register, binary multiplying and summing circuits for calculating term by term products of the contents of said second and third shift registers and then obtaining a sum of said products, a binary adder for adding said sum to a corresponding coefficient of the sum polynomial of the polynomials $S_i(X)$ and monitoring circuits comprising a controlled counter for monitoring said logic circuits; and control means for operating said binary computing unit in accordance with said algorithm during the period of supply by said adding means of the first $n-k$ coefficients to said binary adder of said binary computing unit and to the input of said third register so that the coefficients of a polynomial $\sigma(X)$, which is a product of the polynomials $P_i(X)$ corresponding to the erroneous blocks i, are present in said second shift register at the end of said period, and then for operating said unit as a calculator for computing the most significant coefficients of a correction polynomial $K(X)$ in accordance with the relationship:

$$\sum_{m=0}^{t_x} \sigma_m \cdot k_{p-m} = 0$$

for $n-1 \leq p \leq n-k$ where $k_{p-m}$ represents the coefficients of the polynomial $K(X)$ such that $$K(X) = \sum_{j=1}^{s} S_j(X) \ [X^{n-k}]$$

and $\sigma_m$ represents those of the polynomial $\sigma(X)$ of maximum degree $t_x$, said control means maintaining the coefficients $\sigma_m$ in said second register throughout the period of supply of the k most significant coefficients of said sum polynomial of the polynomials $S_i(X)$ and sending the output sum of said binary multiplying and summing circuits of said binary computing unit to the input of said third shift register.

5. A decoding device according to claim 4, wherein said logic circuits for interconnecting said first and second shift registers are made up so as to form, together with corresponding stages of said first and second shift registers, identical cells, having two data inputs, two data outputs and a first and a second control input, and comprise, for each of said cells, a switch with two inputs respectively connected to said data inputs of the cell, one output connected to an input of the associated stage of said first shift register and one control input connected to said second control input of the cell, an AND gate with two inputs and an exclusive OR gate in series with said AND gate such that an output of said AND gate is connected to an input of said exclusive OR gate, for connecting the output of said first register state to the input of the corresponding stage of said second register, the other input of said exclusive OR gate being connected to the output of said second register stage, a first input of said AND gate being connected to said first control input of said cell and outputs of the corresponding stages of said first and second shift registers being connected respectively to said data outputs of the cell, and wherein said data outputs of each cell are connected respectively to said data inputs of the following cell, the data inputs of the first cell respectively receiving logic levels 0 and 1.

6. A decoding device according to claim 5, wherein said controlled counter of said monitoring circuits comprises e stages in series, where e is such that $2^e \geq 2(n-k)$, the last state of said counter providing the sign bit in two's complement and each of said stages having a serial connection input, a serial connection output, a status output, a blocking input and a control input to control either normal counting, or the inversion of the bit contained in the stage, wherein said monitoring circuits comprise, in addition, a AND gate, one input of which is connected by an inverter to said status output of said last stage of the counter, the second input of which is connected to all the first control inputs of said cells of said binary computing unit and the output of which is connected to the second control inputs of said cells and to the control inputs of said stages of said counter, and wherein said control means comprise first, second and third switches respectively for, during the first n−k coefficients of the polynomials $S_i(X)$, applying an unblocking logic level to the blocking inputs of said stages of said counter, connecting the input of said third register to said input receiving the coefficients of the sum of the polynomials $S_i(X)$ and connecting the output of said binary adder of said binary computing unit to said first control inputs of all said cells and to the second input of said NAND gate, and respectively for, during the last k coefficients of the polynomials $S_i(X)$, applying a blocking logic level to the blocking inputs of said stages of said counter, connecting the input of said third register to the output of said binary multiplying and summing circuits of said binary computing unit and connecting the first control inputs of said cells and the second input of said NAND gate to a logic level 0.

7. A decoding device, according to claim 6, wherein each of said stages of said controlled counter comprises a first NAND gate, the inputs of which are connected respectively to said serial connection input and to said control input of the state, an AND gate, the inputs of which are connected respectively to the output of said NAND gate and to said blocking input of the stage, an exclusive OR gate having a first input connected to the output of said AND gate, a register state, the input of which is connected to the output of said exclusive OR gate and the output of which is connected to said status output of the stage and to the other input of said exclusive OR gate, and a second NAND gate, the inputs of which are connected respectively to the output of said register stage and to the output of said AND gate and the output of which forms said serial connection output of the stage, the serial connection input of the first stage of said counter receiving a logic level 0.

8. A decoding device with error correction and processing of the erased blocks, according to claim 4, wherein said logic circuits of said binary computing unit are arranged so as to form, together with the corresponding stages of said first and second registers, identical cells, having two data inputs, two data outputs and a first, a second and a third control input, and comprise, for each of said cells, a three-position switch with two inputs respectively connected to said data inputs of the cell, two control inputs respectively connected to said second and third control inputs of the cell and one output connected to the input of the associated stage of said first register and providing either one or the other of the coefficients present at said data inputs of the cell, or their binary sum, depending on the logic levels applied to said control inputs of the switch.

9. A decoding device with error correction and processing of the erased blocks according to claim 8, wherein said decoding device further comprises:
first means for storing and restituting, during subsequent processing, the coefficients, relative to terms of degree greater than or equal to one, of all the polynomials $P_i(X)$ associated to the erased blocks, in their order of reception;
seond means for providing a first control signal lasting for a time needed for the first means to restitute all the coefficients of the polynomials erased corresponding to the code word being processed and providing a second control signal taking a logic level 1 during provision by said first means of the last coefficient, associated to the highest degree term of each polynominal $P_i(X)$ corresponding to an erased block; and
third means for monitoring, during the duration of the first control signal and immediately on provision of the first coefficient at the input of said binary computing unit, the operation of said binary computing unit from said first and second control signals, in such a way that, at the end of said first control signal, coefficients of a polynomial $\sigma_{eff}(X)$, equal to the product of the polynomials $P_i(X)$ corresponding to the erased blocks, are available in said second register, said polynomial $\sigma_{eff}(X)$ being used as initial contents of said second shift register for the remainder of the operation in accordance with the decoding algorithm.

10. A decoding device according to claim 9, wherein said third means comprise:
a first switch for applying a blocking voltage to blocking inputs of said stages of said controlled counter throughout the duration of said first control signal and for connecting said blocking inputs to said three-position switch of said control means of said binary computing unit during time other than during said duration of said first control signal;
a second switch, connected to replace, for the duration of said first control signal, the coefficients provided to said NAND gate of said monitoring circuits and to said first control inputs of said cells, by the coefficients restituted by said first means, and
a third and a fourth switch connected to apply to said second and third control inputs of said cells, for the duration of said first control signal, respectively a signal with a logic level 1 and a signal of the same logic level as said control signal and, for said time other than during said duration of said first control signal, respectively the output signal of said NAND gate of said monitoring circuits and its complement, said first register being initialized with a value X and said second register with the value 1 at the beginning of each processing cycle of a code word.

11. A decoding device with error correction for receiving information messages with k bits transmitted by means of code words with n bits forming s blocks of size $d_i$, where i varies from 1 to s, s being a number of polynomials $R_i(X)$ resulting from a factorization of $X^n+1$ over the field GF(2) with two elements and $d_i$ being a degree of the polynomial $P_i(X)$, the bits of each of said blocks being the coefficients of respective polynomials $m_i(X)$ such that $m_i(X) \equiv M(X)A_i(X) \ [P_i(X)]$, where M(X) is the reciprocal of the polynomial M(X) of degree $\leq k-1$ associated to the transmitted message and $A_i(X)$ is the reciprocal of polynomial $P_1'(X)$ which is the derivative of polynomial $P_i(X)$, said decoding device comprising:
s computing circuits and means for transferring the s blocks received to the respective s computing circuits, having $m_i'(X)$ associated polynomials, in order to calculate the coefficients of respective polynomials $S_i(X)$ in accordance with the relationship:

$$S_i(X) = \overline{m_i'(X)} R_i(X)$$

where $\overline{m_i'(X)}$ is the reciprocal polynomial of polynomial $m_i'(X)$ and where $$R_i(X) = \frac{X^n + 1}{P_i(X)}$$

is the reconstitution polynomial, said s computing circuits each including a linear feedback register, the feedback connections of which are arranged so as to divide by the polynomial $\overline{P_i(X)}$, the reciprocal of polynomial $P_i(X)$;

adding means for summing all said polynomials $S_i(X)$ to form a sum polynomial;

a binary computing unit for implementing a decoding algorithm derived from a Berlekamp-Massey algorithm and including a first shift register and a second shift register, each having a plurality of stages, each stage having a rank, first logic circuits for interconnecting said first and second shift registers, a third shift register and a fourth shift register each having a plurality of stages, each stage having a rank, second logic circuits for interconnecting said third and fourth shift registers between themselves and with said first and second shift registers, a binary adder for adding a coefficient present at an output of a last stage of said fourth shift register to a corresponding coefficient of the sum polynomial of the polynomials $S_i(X)$, two interconnection AND gates for applying to the inputs of the first stage of said third and fourth shift registers respectively, products of outputs of final stages of said first and second shift registers, by the successive coefficients of the sum polynomial of the polynomials $S_i(X)$ during a first provision period while the first $n-k$ coefficients are being provided and, by said output coefficient of said fourth shift register, during a second provision period while the last k coefficients are being provided, and monitoring circuits comprising a controlled counter for monitoring said first and second logic circuits;

control means for operating said binary computing unit in accordance with said algorithm during said first provision period of the first $n-k$ coefficients by said fourth register, so that the coefficients of a polynomial $\sigma(X)$, which is the product of the polynomials $P_i(X)$ corresponding to the erroneous blocks i, are present in said second shift register at the end of said period, and then for operating said unit as a calculator for computing most significant coefficients of a correction polynomial $K(X)$ in accordance with the following relationship:

$$\sum_{m=0}^{t_x} \sigma_m \cdot k_{p-m} = 0$$

for $n-1 \geq p \geq n-k$ where $k_{p-m}$ represents coefficients of the polynomial $K(X)$ such that $$K(X) = \sum_{j=1}^{s} S_j(X) [X^{n-k}]$$

and $\sigma_m$ represents those of the polynomial $\sigma(X)$ of maximum degree $t_x$, the successive $k_i$ coefficients being provided at the output of said fourth shift register and said control means maintaining the coefficients $\sigma_m$ in said second shift register throughout a period of supply of the k most significant coefficients of said sum polynomial of the polynomials $S_i(X)$.

12. A decoding device according to claim 11, wherein said binary computing unit is arranged so that, at the moment of index $N+1$ ($N < n-k$), the coefficients which are being written in the stages of index i of said first to fourth registers are given by the following relationships:

(A) If $d_N = 0$ $\sigma_i'^{(N+1)} \leftarrow \sigma_{i-1}'^{(N)}$ and $\sigma_i^{(N+1)} \leftarrow \sigma_i^{(N)}$ $q_i'^{(N+1)} \leftarrow q_i'^{(N)} \oplus s_N \sigma_i'^{(N)}$ $q_i^{(N+1)} \leftarrow q_{i+1}^{(N)} \oplus s_N \sigma_{i+1}^{(N)}$ (B) If $d_N = 1$ and $F < 0$ $\sigma_i'^{(N+1)} \leftarrow \sigma_{i-1}'^{(N)}$ and $\sigma_i^{(N+1)} \leftarrow \sigma_i^{(N)} \oplus \sigma_i'^{(N)}$ $q_i'^{(N+1)} \leftarrow q_i'^{(N)} \oplus s_N \sigma_i'^{(N)}$ $q_i^{(N+1)} \leftarrow q_{i+1}^{(N)} \oplus s_N \sigma_{i+1}^{(N)} \oplus q_{i+1}'^{(N)} \oplus s_N \sigma_{i+1}'^{(N)}$ (C) If $d_N = 1$ and $F \geq 0$ $\sigma_i'^{(N+1)} \leftarrow \sigma_{i-1}^{(N)}$ and $\sigma_i^{(N+1)} \leftarrow \sigma_i^{(N)} \oplus \sigma_i'^{(N)}$ $q_i'^{(N+1)} \leftarrow q_i^{(N)} \oplus s_N \sigma_i^{(N)}$ $q_i^{(N+1)} \leftarrow q_{i+1}^{(N)} \oplus s_N \sigma_{i+1}^{(N)} \oplus q_{i+1}'^{(N)} \oplus s_N \sigma_{i+1}'^{(N)}$ where $d_N$ is the coefficient provided at the output of said fourth register, F the number written in said controlled counter of said monitoring circuits, and i varies from 1 to $n-k$ for the determination of $\sigma$ and $\sigma'$ and from 0 to $n-k-1$ for the determination of q and q'.

13. A decoding device according to claim 12, wherein said first and second logic circuits are arranged so as to form, with $i+1$ rank stages of said first and second shift registers and i rank stages of said third and fourth shift registers, where i varies from 0 to $n-k-1$, identical cells having a first group of two data inputs and two data outputs for said first and second shift registers, a second group of two data inputs and two data outputs for said third and fourth shift registers, a first and a second control input and a first and a second coefficient input connected to a first and a second distribution line and comprise, for each of said cells:

a first three-position switch having two inputs connected to said data inputs of the first group of the cell, two control inputs connected to said first and second control inputs of the cell and one output connected to the input of the associated stage of said first shift register and providing either one of the coefficients present at said data inputs of the first group of the cell, or their binary sum, depending on the logic levels applied to said first and second control inputs;

a first AND gate and first exclusive OR gate, said first AND gate for connecting the output of the associated stage of said first shift register to the input of the corresponding stage of said second register via said first exclusive OR gate by connecting to a first input thereof, the other input of said first exclusive OR gate being connected to the output of said stage of said second shift register, the other input of said first AND gate being connected to said second coefficient input of the cell and the outputs of said stages of said first and second registers being connected respectively to the data outputs of said first group of the cell;

a second three-position switch having two inputs connected to said data outputs of the second group of the cell, two control inputs connected to said first and second control inputs of the cell and one input connected to the input of the associated stage of said third register and providing either one of the coefficients present at said data outputs of the second group of the cell, or their binary sum, depending on the logic levels applied to said first and second control inputs;

a second AND gate and a second exclusive OR gate, said second AND gate having two inputs respectively connected to the data input of said first group, associated to said first register, and to said first coefficient input of the cell and an output connected to one input of said second exclusive OR gate, the other input of which is connected to the output of the associated stage of said third register and the output of which is connected to the data output of said second group, associated to said third shift register;

a third AND gate and a third exclusive OR gate, said third AND gate having two inputs respectively connected to said second coefficient input of the cell and to the data input of said second group, associated to said third register, and an output connected to one input of said third exclusive OR gate, the other input of which is connected to the data input of said second group, associated to said fourth shift register, and the output of which is connected to the input of the associated stage of said fourth shift register; and a fourth AND gate and a fourth exclusive OR gate, said fourth AND gate having two inputs respectively connected to said first coefficient input of the cell and to the data input of said first group, associated to said second shift register, and an output connected to one input of said fourth exclusive OR gate, the other input of which is connected to the output of the associated stage of said fourth shift register and the output of which is connected to the data output of said second group, associated to said fourth shift register; and wherein said data inputs of said first group and said data outputs of said second group of any of said cells are connected respectively to said data outputs of said first group and to said data inputs of said second group of the preceding cell, the data outputs of said first group and the data inputs of said second group of the last cell being interconnected via said interconnection AND gates of said binary computing unit, the data output of said second group of the first cell, associated to said fourth shift register, being connected to said binary adder of said binary computing unit and the data input of said first group of said first cell, associated to said first register, receiving a logic level 0.

14. A decoding device according to claim 13, wherein said controlled counter of said monitoring circuits comprises e stages in series, where e is such that $2^e \geq 2(n-k)$, the last stage of said counter providing the sign bit in two's complement and each of said stages having a serial connection input, a serial connection output, a status output, a blocking input and a control input to control either normal counting or the inversion of the bit contained in the stage, wherein said monitoring circuits also comprise a NAND gate, one input of which is connected by an inverter to said status output of said last stage of the counter, the second input of which is connected to said second distribution line connected to all the second coefficient inputs of said cells of said binary computing unit and the output of which is connected directly to all said control inputs of said stages of said counter and to all said first control inputs of said cells and, via an inverter, to all said second control inputs of said cells, and wherein said control means comprise first to fourth switches respectively for, during the provision of said first $n-k$ coefficients of the polynomials $S_i(X)$, applying an unblocking logic level to the blocking inputs of said stages of said counter, connecting said first distribution line to said input receiving the coefficients of the sum polynomial of the polynomials $S_i(X)$, connecting said second distribution line to the data output of said second group of the first cell, associated to said fourth register, and applying a logic level 1 to the data input of said first group of said first cell, associated to said second register, and respectively for, during the last k coefficients of the polynomials $S_i(X)$, applying a blocking logic level to said blocking inputs of said stages of said counter, connecting said first distribution line to the data output of said second group of said first cell, associated to said fourth register, applying a logic level 0 to said second distribution line and applying a logic level 0 to the data input of said first group of said first cell, associated to said second register.

15. A decoding device according to claim 14, wherein each of said stages of said controlled counter comprises a first counter NAND gate, the inputs of which are connected respectively to said serial connection input and said control input of the stage, a counter AND gate, the inputs of which are connected respectively to the output of said first counter NAND gate and to said blocking input of the stage, a counter exclusive OR gate connected to the output of said counter AND gate, a register stage, the input of which is connected to the output of said counter exclusive OR gate and the output of which is connected to said status output of the stage and to the other input of said counter exclusive OR gate, and a second counter NAND gate, the inputs of which are connected respectively to the output of said register stage and to the output of said counter AND gate, and the output of which forms said serial connection output of the stage, the serial connection input of the first stage of said counter receiving a logic level 0.

16. A decoding device with error correction and processing of the erased blocks according to claim 13, wherein said decoding device further comprises:

first means for storing and restituting, during subsequent processing, the coefficients, relative to terms of degree greater than or equal to one, of all the polynomials $P_i(X)$ associated to the erased blocks, in their order of reception;

second means for providing a first control signal lasting for a time needed for the first means to restitute all the coefficients of the polynomials erased corresponding to the code word being processed and a second control signal taking logic level 1 during provision by said first means of the last coefficient, associated to the highest degree term of each polynomial $P_i(X)$ corresponding to an erased block, and third means for, during the duration of the first control signal and immediately on provision of the first coefficient at the input of said binary computing unit, monitoring operation of said binary computing unit, from said first and second control signals, in such a way that, at the end of said first control signal, coefficients of a polynomial $\sigma_{eff}(X)$, equal to the product of the polynomials $P_i(X)$ corresponding to the erased blocks, are available in said second shift register, said polynomial $\sigma_{eff}(X)$ being used as initial contents of said second register for the remainder of said decoding algorithm.

17. A decoding device according to claim 16, wherein said third means comprise:

a fifth switch for applying a blocking voltage to the blocking inputs of said stages of said controlled counter throughout the duration of said first control signal and for connecting said blocking inputs to said first switch of said control means of said binary computing unit during the remainder of the time;

a sixth switch in order to replace, for the duration of said first control signal, the coefficients provided to said NAND gate of said monitoring circuits and to said second coefficient inputs of said cells, by the coefficients restituted by said first means, and a seventh and a eighth switch in order to apply to said first and second control inputs of said cells, for the duration of said first control signal, respectively a signal with a logic level 1 and a signal of the same logic level as said second control signal and, for the remainder of the time, respectively the output signal of said NAND gate of said monitoring circuits and its complement, said first register being initialized with the value X and said second register with the value 1 at the beginning of each processing cycle of a code word.

* * * * *